(12) United States Patent
Lee

(10) Patent No.: US 8,669,706 B2
(45) Date of Patent: Mar. 11, 2014

(54) INTEGRATED CIRCUITS, CONTROL METHODS AND LIGHTING SYSTEMS

(75) Inventor: Ching-Tsan Lee, Hsin-Chu (TW)

(73) Assignee: Leadtrend Technology Corp., Science-Based Industrial Park, Hsin-Chu (TW)

(*) Notice: Subject to any disclaimer, the term of this patent is extended or adjusted under 35 U.S.C. 154(b) by 125 days.

(21) Appl. No.: 13/311,562

(22) Filed: Dec. 6, 2011

(65) Prior Publication Data

US 2012/0139421 A1 Jun. 7, 2012

(30) Foreign Application Priority Data

Dec. 6, 2010 (TW) ................................ 99142413 A

(51) Int. Cl.
*H05B 37/00* (2006.01)

(52) U.S. Cl.
USPC ............ 315/122; 315/127; 315/192; 315/297

(58) Field of Classification Search
USPC ......... 315/121–123, 125, 127–128, 179–180, 315/185 R, 192–193, 291, 294, 297
See application file for complete search history.

(56) References Cited

U.S. PATENT DOCUMENTS

| 7,675,245 B2* | 3/2010 | Szczeszynski et al. ........ 315/291 |
| 2011/0266972 A1* | 11/2011 | Ling ............................. 315/297 |
| 2012/0074856 A1* | 3/2012 | Takata et al. .................. 315/192 |
| 2012/0086359 A1* | 4/2012 | Wang et al. ................... 315/294 |

* cited by examiner

*Primary Examiner* — James H Cho
(74) *Attorney, Agent, or Firm* — Winston Hsu; Scott Margo

(57) ABSTRACT

Integrated circuits, control methods, and related lighting systems are provided. One integrated circuit controls the currents flowing through light-emitting-diode chains, each having several light emitting diodes forward-connected between a main cathode and a main anode while all the main anodes are connected to a power node. The integrated circuit has a short detection node, a constant current source, a voltage clamping circuit, and a short-circuit comparator. The short detection node detects the highest cathode voltage of the main cathodes. The constant current source provides a constant current to the short detection node. While the light-emitting-diode chains are unlit, the voltage clamping circuit clamps the short detection node at a predetermined voltage. When the voltage of the short detection node exceeds a threshold voltage, the short-circuit comparator asserts a fault signal, indicating a short circuit of a light emitting diode.

9 Claims, 4 Drawing Sheets

INTEGRATED CIRCUITS, CONTROL METHODS AND LIGHTING SYSTEMS

BACKGROUND OF THE INVENTION

1. Field of the Invention

The present invention relates to integrated circuits, control methods, and related light-emitting diode (LED) lighting systems.

2. Description of the Prior Art

Light-emitting diodes (LEDs) have a very good electro-optical conversion rate, which is higher than fluorescent lamps, cold-cathode fluorescent lamps, and light bulbs. Thus, the current trend is to replace these types of lamps with LEDs. For example, LEDs have already gradually replaced CCFLs as a backlight source in liquid crystal display (LCD) panels.

When using LEDs as a backlight source for an LCD panel, due to the LCD panel's large area, a very large number of LEDs must be used, and these LEDs are normally arranged in chains, each chain driven by a controllable current source. Current flowing through each LED chain is controlled to be the same, so that brightness of all LEDs is approximately the same. If light emitted by each LED is given appropriate propagation, brightness of the LCD panel will be reasonably even.

However, if even one LED out of all LEDs in the LCD panel is short-circuited or open-circuited, the LCD panel brightness will be uneven. Thus, a good LED chain driving circuit should have appropriate sensing circuitry to sense whether any LEDs are open- or short-circuited, and take appropriate preventative measures.

SUMMARY OF THE INVENTION

According to an embodiment, an integrated circuit is for controlling current of a plurality of light-emitting diode (LED) chains. Each LED chain has a plurality of LEDs forward-connected between a main anode and a main cathode. Each main anode is coupled to a power node. The integrated circuit comprises a short circuit detection node for detecting maximum cathode voltage of the main cathodes, a constant current source for providing a constant current to the short circuit detection node, a voltage clamping circuit for clamping the short circuit detection node at a predetermined voltage when the LED chains are unlit, and a short circuit comparator for comparing a sense voltage of the short circuit detection node and a threshold voltage, thereby asserting a short-circuit signal when the sense voltage exceeds the threshold voltage.

According to an embodiment, a control method is for using in an integrated circuit. The integrated circuit controls current of a plurality of light-emitting diode (LED) chains. Each LED chain has a plurality of LEDs forward-connected between a main anode and a main cathode. Each main anode is coupled to a power node. The integrated circuit has a short circuit detection node for detecting maximum cathode voltage of the main cathodes. The control method comprises lighting the LED chains, providing a constant current to the short circuit detection node of the integrated circuit when the LED chains are lit, comparing a sense voltage with a threshold voltage, asserting a short-circuit signal when the sense voltage exceeds the threshold voltage, turning off the LED chains, and clamping the sense voltage of the short circuit detection node at a predetermined voltage when the LED chains are unlit.

According to an embodiment, a lighting system comprises a power supply for providing a power node and a ground node, a plurality of light-emitting diode (LED) chains, and an integrated circuit. Each LED chain has a plurality of LEDs forward-connected between a main anode and a main cathode, each main anode coupled to the power node. The integrated circuit comprises a feedback node for detecting minimum cathode voltage of the main cathodes, and a short circuit detection node for detecting maximum cathode voltage of the main cathodes. The short circuit detection node has no signal paths to the ground node other than signal paths through the main cathodes or through internal signal paths of the integrated circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
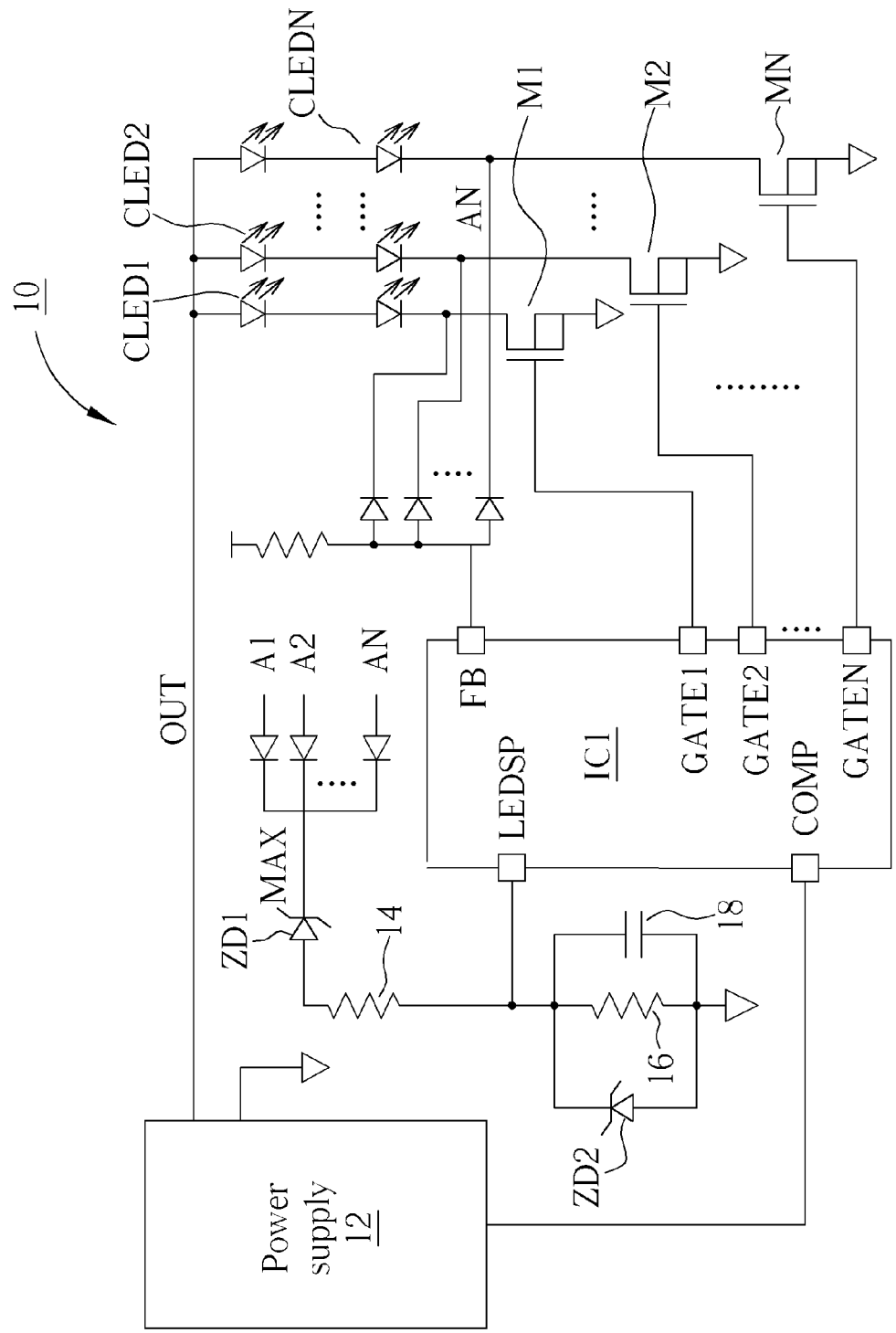
FIG. 1 and FIG. 2 are diagrams of LED lighting systems.

FIG. 1 is a diagram of an LED lighting system 10, which may act as a backlight source for an LCD panel.

Power supply 12 provides a power node OUT and a ground. Voltage of power node OUT may be as high as 100V. LEDs acting as a light source are grouped into N LED chains CLED1 ... CLEDN. As shown, each LED chain has a plurality of LEDs electrically connected in a forward-connected series. From top to bottom, the anode of the first LED of each LED chain is defined as a main anode, and the cathode of the last LED of each LED chain is defined as a main cathode. In the following, all LED chains have the same number of LEDs for purposes of illustration, but LED chains may also have different numbers of LEDs.

All main anodes are tied to power node OUT. Main cathodes A1 ... AN are individually electrically connected to power transistors M1 ... MN. Integrated circuit IC1 individually controls corresponding power transistors M1 ... MN from gates GATE1 ... GATEN to control current flowing through LED chains CLED1 ... CLEDN. For example, if integrated circuit IC1 has a dimming signal $S_{DIMMING}$, assertion of dimming signal $S_{DIMMING}$ indicates LEDs are emitting light, and current flowing through each LED chain is 100 mA. Disassertion of dimming signal $S_{DIMMING}$ indicates LEDs are not emitting light, and current flowing through each LED chain is 0 mA.

Integrated circuit IC1 uses feedback node FB to detect minimum cathode voltage $V_{A-MIN}$ of main cathodes A1 ... AN. From circuit connections between feedback node FB and main cathodes A1 ... AN, it can be seen that voltage $V_{FB}$ of feedback node FB is described by the following equation:

$$V_{FB} = V_{A-MIN} + V_{TH-DIODE} \qquad (1)$$

where $V_{TH-DIODE}$ is one diode forward voltage drop. According to voltage $V_{FB}$, integrated circuit IC1 may provide compensation signal to power supply 12 through compensation node COMP to adjust voltage at power node OUT, so that minimum cathode voltage $V_{A-MIN}$ can be held at approximately target value $V_{TAR}$, e.g. 1V.

Integrated circuit IC1 uses LED short-circuit protection node LEDSP to detect maximum cathode voltage $V_{A-MAX}$ of main cathodes A1 . . . AN. Cathodes of N LEDs are coupled to common node MAX, and anodes thereof are individually coupled to main cathodes A . . . AN. Zener diode ZD1 and resistor 14 are electrically connected in series from LED short-circuit protection node LEDSP and common node MAX. It can be seen from interconnections between LED short-circuit protection node LEDSP and main cathodes A1 . . . AN that sense voltage $V_{LEDSP}$ at LED short-circuit protection node LEDSP is roughly described by the following equations:

$$V_{MAX} = V_{A-MAX} - V_{TH-DIODE}, \quad (2)$$

$$V_{LEDSP} = (V_{MAX} - V_{BD-ZD1}) * R_{16}/(R_{14} + R_{16}) \quad (3)$$

where $V_{MAX}$ is voltage at common node MAX, $V_{BD-ZD1}$ is breakdown voltage of Zener diode ZD1, and $R_{14}$ and $R_{16}$ are resistance values of resistors 14 and 16.

If operating voltage $V_{ON-LED}$ of each LED is approximately the same, and number of LEDs in each LED chain is the same, then it can be seen that minimum cathode voltage $V_{A-MIN}$ and maximum cathode voltage $V_{A-MAX}$ are both approximately equal to target value $V_{TAR}$ when all LEDs emit light normally. Equations (2) and (3) describe sense voltage $V_{LEDSP}$ of LED short-circuit protection node LEDSP corresponding to no LEDs being short-circuited.

If one LED chain has k short-circuited LEDs, maximum cathode voltage $V_{A-MAX}$ will be higher than minimum cathode voltage $V_{A-MIN}$ by approximately $k*V_{ON-LED}$. This difference is reflected in a change in sense voltage $V_{LEDSP}$. For example, if integrated circuit IC1 discovers that sense voltage $V_{LEDSP}$ is higher by one threshold voltage $V_{TH-SH}$ when LED chains CLED1 . . . CLEDN are lit, it can be determined that one or more LEDs have short-circuited, and short-circuit signal $S_{SHT}$ can be asserted to take corresponding short-circuit protection measures. For example, protection measures may include forced shutdown of power transistors M1 . . . MN to stop LED chains CLED1 . . . CLEDN from emitting light.

Zener diode ZD2 limits maximum value of sense voltage $V_{LEDSP}$. Zener diode ZD2 can prevent maximum cathode voltage $V_{A-MAX}$ from approaching power node OUT voltage (up to 100V) when LED chains are not lit, which would damage integrated circuit IC1 if sense voltage $V_{LEDSP}$ goes too high.

Figure 2:
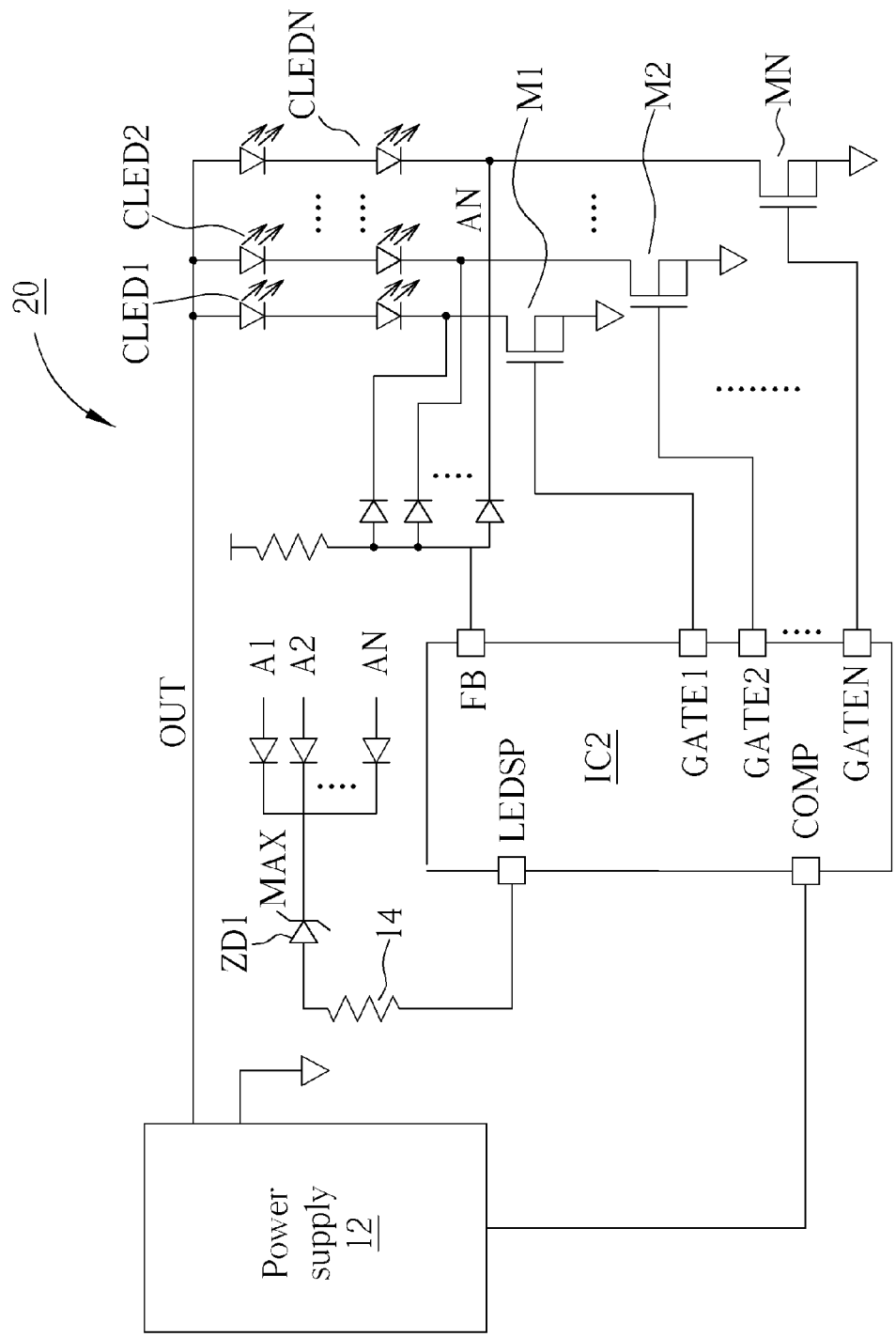

FIG. 2 is a diagram of an LED lighting system 20, which can also act as an LCD panel backlight source. FIG. 2 is different from FIG. 1 in that circuit design of integrated circuit IC2 is different from integrated circuit IC1, and FIG. 2 does not require Zener diode ZD2, resistor 16, and capacitor 18 of FIG. 1. As shown in FIG. 2, no additional external discrete components need be electrically connected between LED short-circuit protection node LEDSP of integrated circuit IC2 and ground node of power supply 12 beyond signal path through main cathodes A1 . . . AN and power transistors M1 . . . MN, and internal signal paths of integrated circuit IC2. Or, no additional signal paths connect LED short-circuit protection node LEDSP to power supply 12 ground node other than signal path through main cathodes A1 . . . AN, and internal signal paths of integrated circuit IC2. It can be seen by comparing FIG. 1 and FIG. 2 that LED lighting system 20 uses a lower number of external discrete components, which makes LED lighting system 20 more cost competitive than LED lighting system 10.

Figure 3:
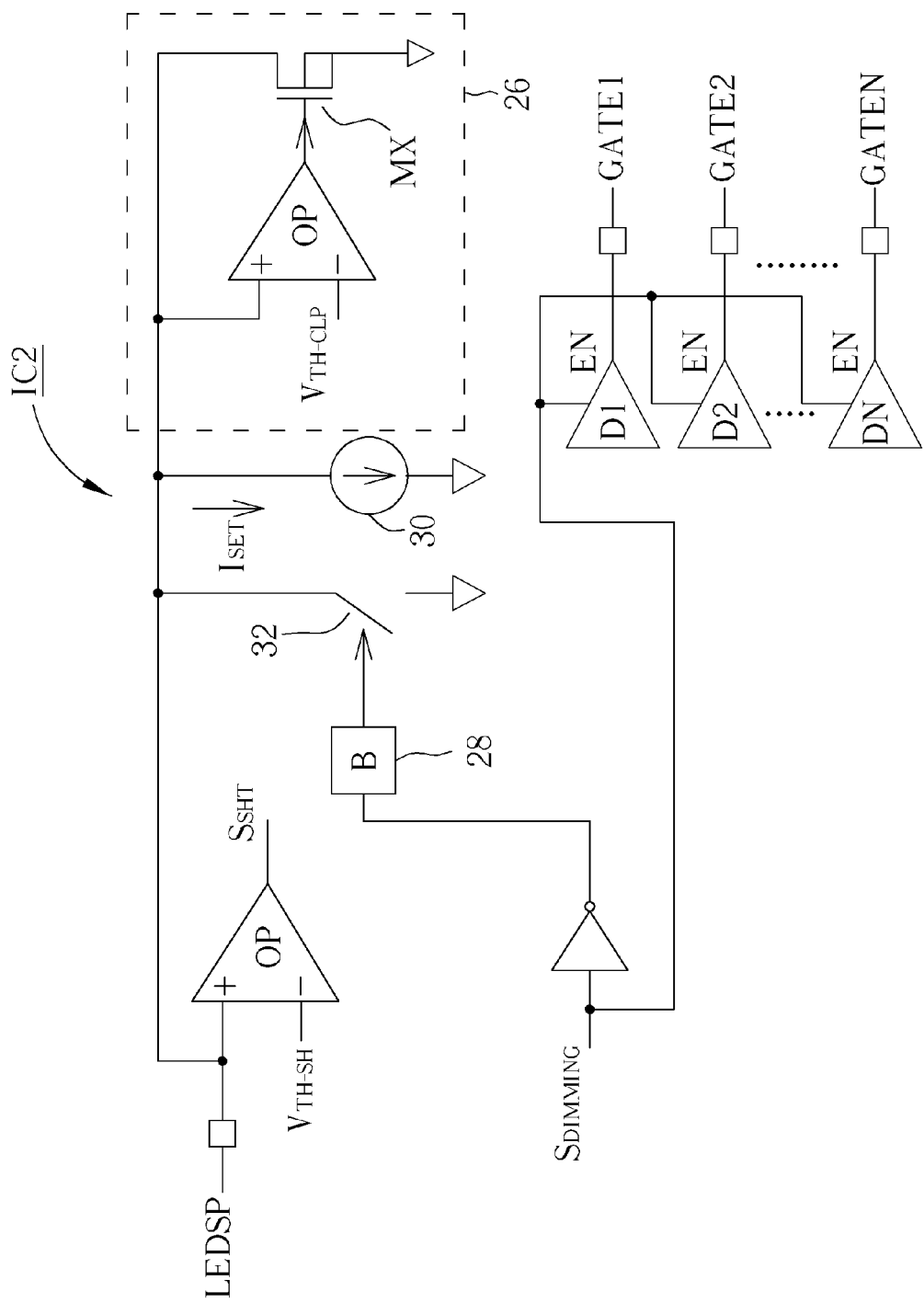
FIG. 3 is a partial circuit diagram of integrated circuit of FIG. 2.

FIG. 3 is a partial circuit diagram of integrated circuit IC2 of FIG. 2. When dimming signal $S_{DIMMING}$ is asserted, driving circuits D1 . . . DN individually drive power transistors M1 . . . MN to cause LED chains CLED1 . . . CLEDN to emit light. When driving signal $S_{DIMMING}$ is disasserted, driving circuits D1 . . . DN are disabled to shut off power transistors M1 . . . MN, and cause LED chains CLED1 . . . CLEDN not to emit light.

At about the time dimming signal $S_{DIMMING}$ is disasserted, switch 32 acting as a voltage clamping circuit becomes a short circuit to keep LED short-circuit protection node LEDSP fixed at 0V. Current flowing through switch 32 can be externally limited appropriately through Zener diode ZD1 and resistor 14. In this way, even if maximum cathode voltage $V_{A-MAX}$ equals power node OUT voltage, integrated circuit IC2 will not be damaged by high voltage. Switch 32 does not necessarily need to fix LED short-circuit protection node LEDSP at 0V, but may also fix LED short-circuit protection node LEDSP at another voltage, e.g. operation voltage VCC of integrated circuit IC2.

At about the time dimming signal $S_{DIMMING}$ is asserted, switch 32 becomes an open circuit, and constant current source 30 draws a constant current $I_{SET}$ from LED short-circuit protection node LEDSP. At this time, sense voltage $V_{LEDSP}$ can be approximated by the following equation:

$$V_{LEDSP} = V_{MAX} - V_{BD-ZD1} - I_{SET} * R_{14}. \quad (4)$$

From equations (4) and (2), it can be seen that sense voltage $V_{LEDSP}$ can correspond to maximum cathode voltage $V_{A-MAX}$ of main cathodes A1 . . . AN. Comparator CM compares sense voltage $V_{LEDSP}$ and threshold voltage $V_{TH-SH}$. When sense voltage $V_{LEDSP}$ is higher than threshold voltage $V_{TH-SH}$, it can be determined that at least one LED has short-circuited, so short-circuit signal $S_{SHT}$ is asserted to engage corresponding short-circuit protection measures.

Clamping circuit 26 is used for limiting maximum value of sense voltage $V_{LEDSP}$ to prevent any problems that may occur if sense voltage $V_{LEDSP}$ goes too high due to too many LEDs shorting. In FIG. 3, clamping circuit 26 is formed of operational amplifier OP and NMOS transistor MX as an example, and can limit sense voltage $V_{LEDSP}$ to be lower than clamp voltage $V_{TH-CLP}$.

Delay circuit 28 provides delay. For example, delay circuit 28 provides delay period $T_{B1}$ to rising edge of dimming signal $S_{DIMMING}$, and delay period $T_{B2}$ to falling edge of dimming signal $S_{DIMMING}$. It can be seen from the circuit of FIG. 3 that after rising edge of dimming signal $S_{DIMMING}$, switch 32 can only be opened after delay period $T_{B1}$. Thus, within delay period $T_{B1}$ after LED chain starts emitting light, because sense voltage $V_{LEDSP}$ is still fixed at 0V by short-circuited switch 32, which is lower than threshold voltage $V_{TH-SH}$, short-circuit signal $S_{SHT}$ is not asserted.

Figure 4:
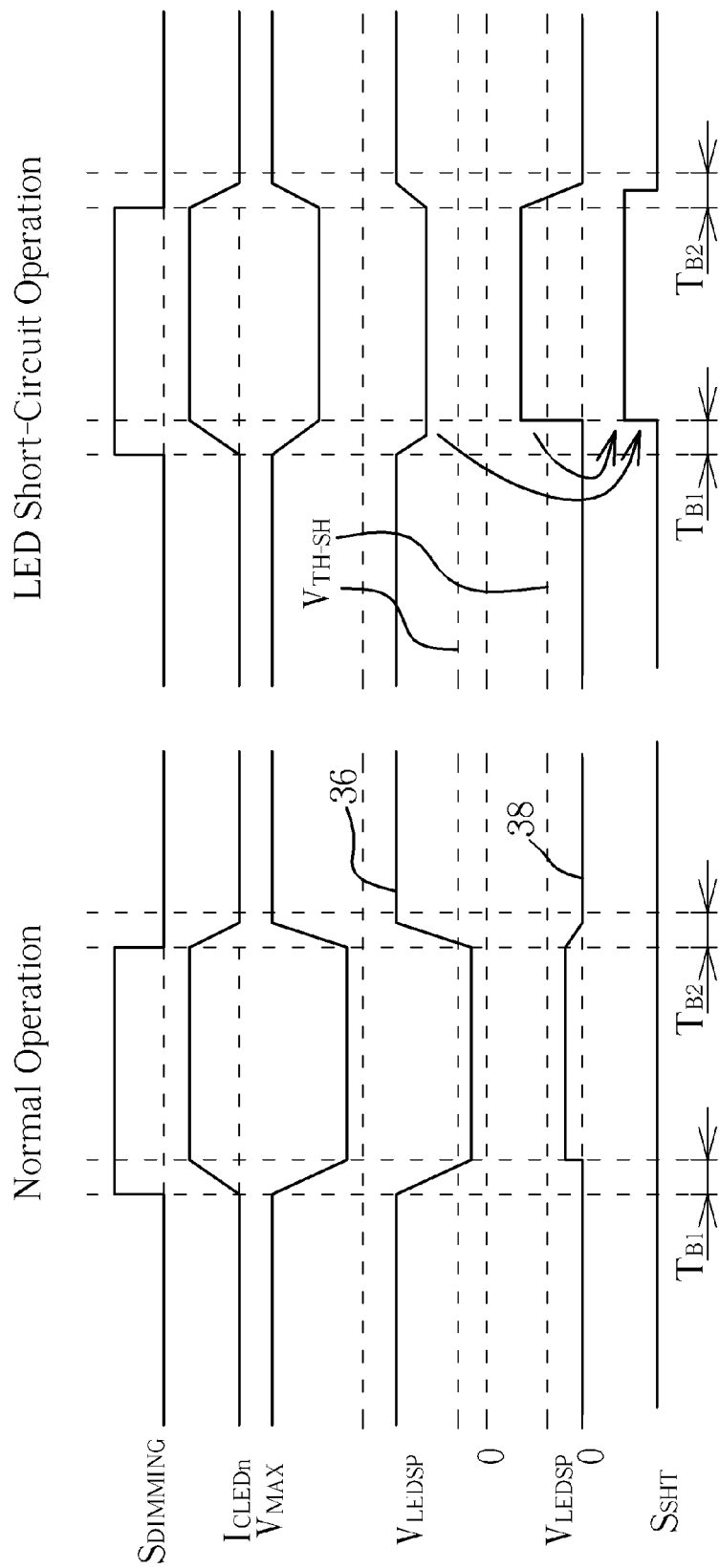
FIG. 4 illustrates signal waveforms of LED lighting systems of FIG. 1 and FIG. 2 during normal operation (no LEDs short-circuited) and during abnormal operation (one or more LEDs short-circuited).

FIG. 4 illustrates signal waveforms of LED lighting systems 10, 20 of FIG. 1 and FIG. 2 during normal operation (no LEDs short-circuited) and during abnormal operation (one or more LEDs short-circuited). From top to bottom, signal waveforms of FIG. 4 represent dimming signal $S_{DIMMING}$, current $I_{CLEDn}$ flowing through LED chain CLEDn, voltage $V_{MAX}$ of common terminal MAX, sense voltage $V_{LEDSP}$ of FIG. 1, sense voltage $V_{LEDSP}$ of FIG. 2, and short-circuit signal $S_{SHT}$, respectively. The left half of FIG. 4 shows signal waveforms under normal operation with no LEDs short-circuited, and the right half of FIG. 4 shows signal waveforms when one or more LEDs is short-circuited.

Please refer to FIG. 4 and FIG. 1. When dimming signal $S_{DIMMING}$ is disasserted, current $I_{CLEDn}$ is approximately 0 A, and voltage $V_{MAX}$ is very high, so sense voltage $V_{LEDSP}$ shown by waveform 36 is also very high. At this time, although sense voltage $V_{LEDSP}$ is higher than threshold voltage $V_{TH-SH}$, integrated circuit IC1 forces disassertion of short-circuit signal $S_{SHT}$. When dimming signal $S_{DIMMING}$ is asserted, current $I_{CLEDn}$ is controlled approximately to a predetermined value. If no LEDs are short-circuited, as shown in the left half of FIG. 4, voltage $V_{MAX}$ falls approximately to an abnormally low value, so that sense voltage $V_{LEDSP}$ is lower than threshold voltage $V_{TH-SH}$, so short-circuit signal $S_{SHT}$ remains disasserted. If one or more LEDs is short-circuited, as shown in the right half of FIG. 4, voltage $V_{MAX}$ will drop to a relatively high value, so that sense voltage $V_{LEDSP}$ exceeds threshold voltage $V_{TH-SH}$, so short-circuit signal $S_{SHT}$ is asserted.

Please refer to FIG. 4, FIG. 2, and FIG. 3. When dimming signal $S_{DIMMING}$ is disasserted, voltage $V_{MAX}$ is very high, but sense voltage $V_{LEDSP}$ shown by waveform 38 is fixed to 0V due to switch 32 being open-circuited, so short-circuit signal $S_{SHT}$ is disasserted. After dimming signal $S_{DIMMING}$ is asserted for delay period $T_{B1}$, current $I_{CLEDn}$ is approximately controlled to a predetermined value. If no LEDs are short-circuited, as shown in the left half of FIG. 4, sense voltage $V_{LEDSP}$ will rise to a relatively low voltage value, which is lower than threshold voltage $V_{TH-SH}$, so short-circuit signal $S_{SHT}$ remains disasserted. If one or more LEDs is short-circuited, as shown in the right half of FIG. 4, sense voltage $V_{LEDSP}$ will rise to a relatively high voltage value, so that sense voltage $V_{LEDSP}$ exceeds threshold voltage $V_{TH-SH}$, so short-circuit signal $S_{SHT}$ will be asserted.

FIG. 1 and FIG. 2 both use Zener diode ZD1. However, in other embodiments, Zener diode ZD1 may be omitted, such that resistor 14 is directly coupled to common node MAX.

Power supply 12 may use any power conversion architecture, including, but not limited to, flyback, boost, and buck architectures.

Power transistors M1 . . . MN shown in FIG. 1 and FIG. 2 may be MOS transistors or BJT transistors. In some embodiments, integrated circuit IC1 or IC2 and power transistors M1 . . . MN are integrated into a single chip or a single IC package.

LED lighting systems 10, 20 can both detect whether or not any LED is short-circuited. Compared to LED lighting system 10, LED lighting system 20 is more cost competitive.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit for controlling current of a plurality of light-emitting diode (LED) chains, each LED chain having a plurality of LEDs forward-connected between a main anode and a main cathode, each main anode coupled to a power node, the integrated circuit comprising:
a short circuit detection node for detecting maximum cathode voltage of the main cathodes;
a constant current source for providing a constant current to the short circuit detection node;
a voltage clamping circuit for clamping the short circuit detection node at a predetermined voltage when the LED chains are unlit; and
a short circuit comparator for comparing a sense voltage of the short circuit detection node and a threshold voltage, thereby asserting a short-circuit signal when the sense voltage exceeds the threshold voltage.

2. The integrated circuit of claim 1, further comprising:
a clamping circuit for clamping maximum value of the sense voltage.

3. The integrated circuit of claim 1, further comprising:
a delay circuit for preventing assertion of the short-circuit signal within a predetermined period after the LED chains start emitting light.

4. A control method for using in an integrated circuit, the integrated circuit controlling current of a plurality of light-emitting diode (LED) chains, each LED chain having a plurality of LEDs forward-connected between a main anode and a main cathode, each main anode coupled to a power node, the integrated circuit having a short circuit detection node for detecting maximum cathode voltage of the main cathodes, the control method comprising:
lighting the LED chains;
providing a constant current to the short circuit detection node of the integrated circuit when the LED chains are lit;
comparing a sense voltage with a threshold voltage;
asserting a short-circuit signal when the sense voltage exceeds the threshold voltage;
turning off the LED chains; and
clamping the sense voltage of the short circuit detection node at a predetermined voltage when the LED chains are unlit.

5. The control method of claim 4, further comprising:
clamping maximum value of the sense voltage.

6. A lighting system comprising:
a power supply for providing a power node and a ground node;
a plurality of light-emitting diode (LED) chains, each LED chain having a plurality of LEDs forward-connected between a main anode and a main cathode, each main anode coupled to the power node;
an integrated circuit comprising:
a feedback node for detecting minimum cathode voltage of the main cathodes; and
a short circuit detection node for detecting maximum cathode voltage of the main cathodes;
a plurality of LEDs, each having an anode coupled to a corresponding main cathode and a cathode coupled to a common node; and
a resistor coupled between the common node and the short circuit detection node;
wherein the short circuit detection node has no signal paths to the ground node other than signal paths through the main cathodes or through internal signal paths of the integrated circuit.

7. The lighting system of claim 6, further comprising a Zener diode coupled in series with the resistor between the common node and the short circuit detection node.

8. The lighting system of claim 6, wherein the integrated circuit comprises:
a constant current source for providing a constant current to the short circuit detection node; and
a switch for clamping the short circuit detection node to a predetermined voltage when the LED chains are unlit.

9. The lighting system of claim 8, wherein the integrated circuit comprises:
a short circuit comparator for comparing a sense voltage of the short circuit detection node with a threshold voltage, and asserting a short-circuit signal when the sense voltage exceeds the threshold voltage.

* * * * *